(12) United States Patent
Wang

(10) Patent No.: US 10,580,905 B2
(45) Date of Patent: Mar. 3, 2020

(54) THIN FILM TRANSISTOR HAVING ETCH STOP MULTI-LAYER AND METHOD OF PREPARING THE SAME

(71) Applicant: Shenzhen China Star Optoelectronics Technology Co., Ltd., Shenzhen (CN)

(72) Inventor: Zhiwu Wang, Shenzhen (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 115 days.

(21) Appl. No.: 15/102,426

(22) PCT Filed: Mar. 16, 2016

(86) PCT No.: PCT/CN2016/076514
§ 371 (c)(1),
(2) Date: Jun. 7, 2016

(87) PCT Pub. No.: WO2017/143636
PCT Pub. Date: Aug. 31, 2017

(65) Prior Publication Data
US 2018/0097115 A1    Apr. 5, 2018

(30) Foreign Application Priority Data
Feb. 24, 2016 (CN) .......................... 2016 1 0102286

(51) Int. Cl.
*H01L 27/12* (2006.01)
*H01L 21/768* (2006.01)
(Continued)

(52) U.S. Cl.
CPC .... *H01L 29/7869* (2013.01); *H01L 29/42384* (2013.01); *H01L 29/4908* (2013.01); *H01L 29/66969* (2013.01); *H01L 29/78* (2013.01)

(58) Field of Classification Search
CPC ......... H01L 29/78669; H01L 29/78678; H01L 29/66765; H01L 29/42384; H01L 29/4908
See application file for complete search history.

(56) References Cited

U.S. PATENT DOCUMENTS 8,946,701 B2    2/2015  Cao et al.
9,236,405 B2    1/2016  Liu
(Continued)

FOREIGN PATENT DOCUMENTS

CN    102171833 A    8/2011
CN    202423298      9/2012
(Continued)

OTHER PUBLICATIONS

International Search Report for PCT/CN2016/076514, Completed by the Chinese Patent Office, dated Nov. 23, 2016, 12 Pages.

*Primary Examiner* — Stephen M Bradley
(74) *Attorney, Agent, or Firm* — Mintz Levin Cohn Ferris Glovsky and Popeo, P.C.; Steven M. Jensen

(57) ABSTRACT

The present disclosure provides a thin film transistor and a method of preparing the same. The thin film transistor includes a substrate; a gate provided on the substrate; a gate insulating layer provided on the substrate and completely covering the gate; a semiconductor layer provided on the gate insulating layer; and an etch stop layer and a source/drain electrode layer provided on the semiconductor layer. The etch stop layer includes a first stop layer provided on a side of the channel region, the side being away from the gate, and a second stop layer provided on the first stop layer. The thin film transistor and the method for preparing the same as proposed in the present disclosure can prevent the device from being damaged by a high temperature and reduce the film-forming time and increase productivity; the $SiO_2$ can be prepared at a lower temperature.

5 Claims, 2 Drawing Sheets

(51) Int. Cl.
*H01L 23/535* (2006.01)
*H01L 29/417* (2006.01)
*H01L 29/66* (2006.01)
*H01L 29/786* (2006.01)
*H01L 29/78* (2006.01)
*H01L 29/423* (2006.01)
*H01L 29/49* (2006.01)

(56) References Cited

U.S. PATENT DOCUMENTS

| | | | | |
|---|---|---|---|---|
| 10,297,651 | B2* | 5/2019 | Zhai | H01L 27/3258 |
| 2010/0102407 | A1* | 4/2010 | Kajiyama | H01L 27/228 |
| | | | | 257/421 |
| 2010/0193784 | A1 | 8/2010 | Morosawa et al. | |
| 2011/0163310 | A1* | 7/2011 | Park | H01L 29/78606 |
| | | | | 257/43 |
| 2012/0220132 | A1* | 8/2012 | Oyama | H01L 21/0337 |
| | | | | 438/703 |
| 2013/0193431 | A1* | 8/2013 | Yamazaki | H01L 29/78693 |
| | | | | 257/43 |
| 2013/0240878 | A1* | 9/2013 | Morosawa | H01L 29/7869 |
| | | | | 257/43 |
| 2014/0326990 | A1 | 11/2014 | Wang et al. | |

FOREIGN PATENT DOCUMENTS

| | | |
|---|---|---|
| CN | 102709239 | 10/2012 |
| CN | 103219283 | 7/2013 |
| CN | 103887343 A | 6/2014 |

\* cited by examiner

THIN FILM TRANSISTOR HAVING ETCH STOP MULTI-LAYER AND METHOD OF PREPARING THE SAME

CROSS-REFERENCE TO RELATED APPLICATION

This application is the U.S. national phase of PCT Application No. PCT/CN2016/076514 filed on Mar. 16, 2016, which claims priority to CN Patent Application No. 201610102286.3 filed on Feb. 24, 2016, the disclosures of which are incorporated in their entirety by reference herein.

BACKGROUND OF THE INVENTION

1. Field of the Invention

The present disclosure relates to the technical field of semiconductor, and in particular, to a thin film transistor and a method of preparing the same.

2. Discussion of the Related Art

Currently, a thin film transistor (TFT) is mainly applied to control and drive sub-pixels of a liquid crystal display (LCD) and an organic light emitting diode (OLED), which is the most important electronic device in the flat panel display field. A TFT technique of using a metal oxide as a channel layer material has become a highlight of research in the current display field.

In the prior art, the indium gallium zinc oxide (IGZO) is widely applied as the channel layer material. By employing IGZO in TFT, a power consumption of a display screen can be close to the OLED, but the cost is lower, and the thickness is only 25% larger than the OLED, also, the resolution may reach the full high definition (full HD, 1920*1080P) or even the ultra definition (resolution 4 k*2 k) level. When forming a source/drain metal electrode, in order to prevent a metal oxide layer from being damaged and to improve the performance of the metal oxide TFT, an etch stop layer (ESL) metal oxide TFT is generally used. The etch stop layer is a silicon dioxide ($SiO_2$) thin film prepared by using a plasma-enhanced chemical vapor deposition (PECVD) method, the reaction gases used for preparing the $SiO_2$ thin film are $SiH_4$ and $N_2O$, or TEOS and $O_2$, and the product is $SiO_x$:H, thus the $SiO_2$ thin film layer contains hydrogen. When the $SiO_2$ thin film layer is formed at a high temperature, a diffusion of H may cause a reduction reaction of IGZO, hence causing the deterioration of electrical property of the TFT device. Moreover, the high temperature may increase the chance of damaging the IGZO; however, when the $SiO_2$ thin film layer is formed at a low temperature, the content of H will increase accordingly, and the pin holes may tend to occur, which may also cause the deterioration of electrical property of the TFT device. Based on above, in order to maintain the stability of the IGZO TFT device, the content of hydrogen in the etch stop layer must be reduced so as to avoid the occurrence of the pin holes.

Aluminum oxide ($Al_2O_3$) is an group semiconductor material having a wide bandgap and good physical and chemical properties. In the prior art, the $Al_2O_3$ may also be applied as the etch stop layer, as an alternative to the $SiO_2$. However, the film-forming rate of $Al_2O_3$ is slow, the equipment for producing the same is complex, and the production cost is high, which goes against industrialization.

SUMMARY

In order to overcome the deficiencies of the prior art, the present disclosure proposes a thin film transistor and method of preparing the same, which can prevent the device from being damaged by a high temperature, reduce the film-forming time, and increase the productivity.

The specific technical solutions proposed by the present disclosure are as follows: a thin film transistor, comprising:
a substrate;
a gate provided on the substrate;
a gate insulating layer provided on the substrate and completely covering the gate;
a semiconductor layer provided on the gate insulating layer, the semiconductor layer further comprising a channel region corresponding to the gate;
an etch stop layer provided on the semiconductor layer, the etch stop layer comprising a first stop layer provided on a side of the channel region, the side being away from the gate, and a second stop layer provided on the first stop layer; and
a source/drain electrode layer provided on the semiconductor layer, and the source/drain electrode layer includes a source electrode and a drain electrode connected with the etch stop layer respectively;
wherein the etch stop layer is used to protect the semiconductor layer when etching the source/drain electrode layer to form the source electrode and the drain electrode; and a projection area of the semiconductor layer on the substrate is smaller than a projection area of the gate insulating layer on the substrate.

Furthermore, the first stop layer is an aluminum oxide thin film; and the second stop layer is a silicon dioxide thin film.

Furthermore, a thickness of the first stop layer is 10-2000 Å; and a thickness of the second stop layer is 50-3000 Å.

Furthermore, the semiconductor layer is made from a metal oxide semiconductor material.

Furthermore, the thin film transistor further comprises a protection layer provided on the gate insulating layer and completely covering the semiconductor layer, the source/drain electrode layer and the etch stop layer.

Furthermore, the gate is copper or copper alloy.

The present disclosure further provides a method for preparing a thin film transistor as mentioned above, including:
depositing a first conductive thin film on the substrate and patterning the first conductive thin film to form the gate;
depositing a first insulating thin film on the substrate formed with the gate to form the gate insulating layer, so that the gate insulating layer completely covers the gate;
depositing one layer of metal oxide thin film on the gate insulating layer and patterning the metal oxide thin film to form the semiconductor layer, so that a channel region of the semiconductor layer corresponds to the gate;
depositing a second insulating thin film and a third insulating thin film successively on a side of the channel region, the side being away from the gate, and patterning the third insulating thin film and the second insulating thin film successively to form the second stop layer and the first stop layer;
depositing a second conductive thin film on the semiconductor layer to form the source/drain electrode layer, so that the source/drain electrode layer completely covers the first stop layer and the second stop layer;
etching the source/drain electrode layer to form the source electrode and the drain electrode, so that the source electrode and the drain electrode are separated from each other and are provided at both sides of the first stop layer and the second stop layer.

Furthermore, the first stop layer is an aluminum oxide thin film, the second stop layer is a silicon dioxide thin film, a thickness of the first stop layer is 10-2000 Å, and a thickness of the second stop layer is 50-3000 Å.

Furthermore, a temperature for forming the second stop layer is 100° C.-250° C.

Furthermore, the thin film transistor further includes a protection layer provided on the gate insulating layer and completely covering the semiconductor layer, the source/drain electrode layer and the etch stop layer, and the method further includes:

depositing one layer of passivation thin film on the gate insulating layer to form the protection layer, so that the protection layer completely covers the semiconductor layer, the source/drain electrode layer and the etch stop layer.

The thin film transistor and the method for preparing the same as proposed in the present disclosure adopt the $SiO_2/Al_2O_3$ double layer thin film structure to replace the $SiO_2$ single layer thin film structure as the etch stop layer, wherein the $Al_2O_3$ thin film layer is relatively thin, and the $SiO_2$ thin film layer is relatively thick. In this way, the $Al_2O_3$ thin film layer does not include hydrogen, which can avoid the reduction reaction of the metal oxide; the $Al_2O_3$ can be prepared at a low temperature so as to prevent the device from being damaged by a high temperature; the $Al_2O_3$ is relatively thin, which can reduce the film-forming time and increase productivity; and the $SiO_2$ can be prepared at a lower temperature with the $Al_2O_3$ being a basis, so as to prevent the device from being damaged by a high temperature.

DETAILED DESCRIPTION OF EXEMPLARY EMBODIMENTS

Figure 1:
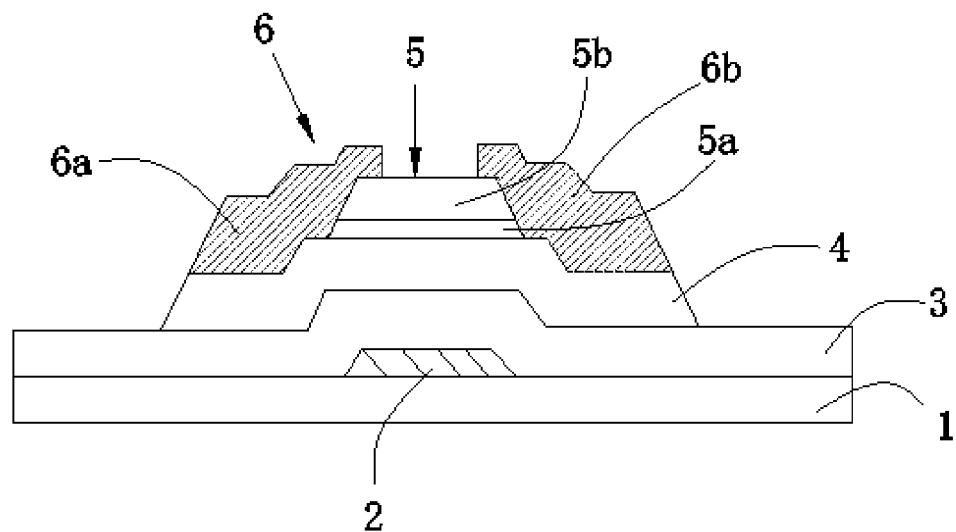
FIG. 1 is a structural schematic diagram of the thin film transistor of the present disclosure.

Embodiments of the present invention will be described in detail below by referring to the accompany drawings. However, the present invention can be implemented in different manners and should not be interpreted to be limited to the specific embodiments set forth herein. Instead, these embodiments are provided for explaining the principle and actual application of the present invention, and thus those skilled in the art can understand various embodiments and amendments which are suitable for specific intended applications of the present invention. In the drawings, the same reference numeral will always be used to indicate the same element.

Embodiment 1

Referring to FIG. 1, the present embodiment provides a bottom-gate thin film transistor including a substrate 1, a gate 2, a gate insulating layer 3, a semiconductor layer 4, an etch stop layer 5 and a source/drain electrode layer 6.

The substrate 1 is a transparent glass substrate or a PET substrate, and the gate 2 is formed on the substrate 1 through patterning and is made from a metal conductive material such as a simple substance selected from aluminum, copper and molybdenum, or an aluminum alloy. The gate insulating layer 3 is provided on the substrate 1 and completely covers the gate 2, and a material of the gate insulating layer 3 is one of a silicon oxide thin film, a silicon nitride thin film and a silicon oxynitride thin film, or a composite structure of the above three thin films.

The semiconductor layer 4 is formed on the gate insulating layer 3 by patterning, and is made from a metal oxide such as an indium gallium zinc oxide (IGZO), a hafnium indium zinc oxide (HIZO), an indium zinc oxide (IZO) and a-InZnO, etc., and preferably, the semiconductor layer is made from IGZO. The etch stop layer 5 and the source/drain electrode layer 6 are formed on the semiconductor layer 4, wherein a region corresponding to the gate 2 in the semiconductor layer 4 is a channel region of the semiconductor layer 4, and the etch stop layer 5 is provided on a side of the channel region, the side being away from the gate 2.

The source/drain electrode layer 6 includes a source electrode 6a and a drain electrode 6b. The source electrode 6a and the drain electrode 6b are provided on both sides of the etch stop layer 5 respectively, and in a top view of the thin film transistor, the source electrode and the drain electrode are interconnected (not shown in the drawings). The source electrode 6a and the drain electrode 6b are made from the metal conductive material such as a simple substance selected from aluminum, copper and molybdenum, or an aluminum alloy. In order to prevent the gate 2 from being suffered from mutual affect with the semiconductor layer 4 and the source/drain electrode layer 6, causing performance degradation of the thin film transistor, the respective projection areas of the semiconductor layer 4 and the source/drain electrode layer 6 on the substrate 1 are smaller than a projection area of the gate insulating layer 3 on the substrate 1.

In order to protect the semiconductor layer 4 from being damaged when etching the source/drain electrode layer 6 to form the source electrode 6a and the drain electrode 6b, the etch stop layer 5 includes a first stop layer 5a provided on a side of the channel region, the side being away from the gate 2, and a second stop layer 5b provided on the first stop layer 5a, and preferably, the first stop layer 5a is an aluminum oxide thin film, and the second stop layer 5b is a silicon dioxide thin film.

Figure 2:
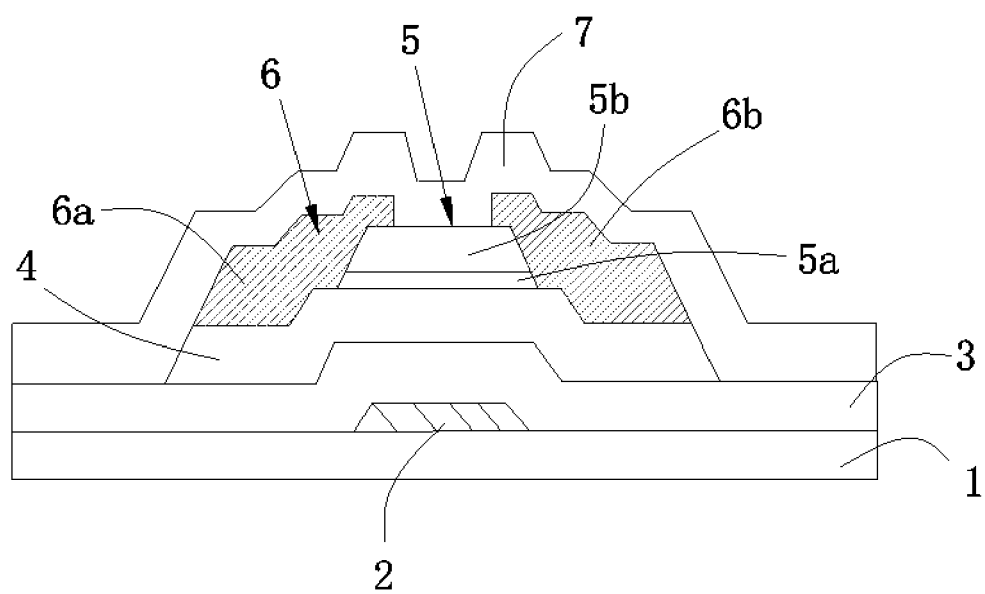
FIG. 2 is another structural schematic diagram of the thin film transistor of the present disclosure.

Referring to FIG. 2, in order to improve the stability of the thin film transistor, the thin film transistor further includes a protection layer 7 which is provided on the gate insulating layer 3 and completely covers the semiconductor layer 4, the etch stop layer 5 and the source/drain electrode layer 6, wherein the protection layer can be an oxide, a nitride or an oxynitride.

Figure 3:
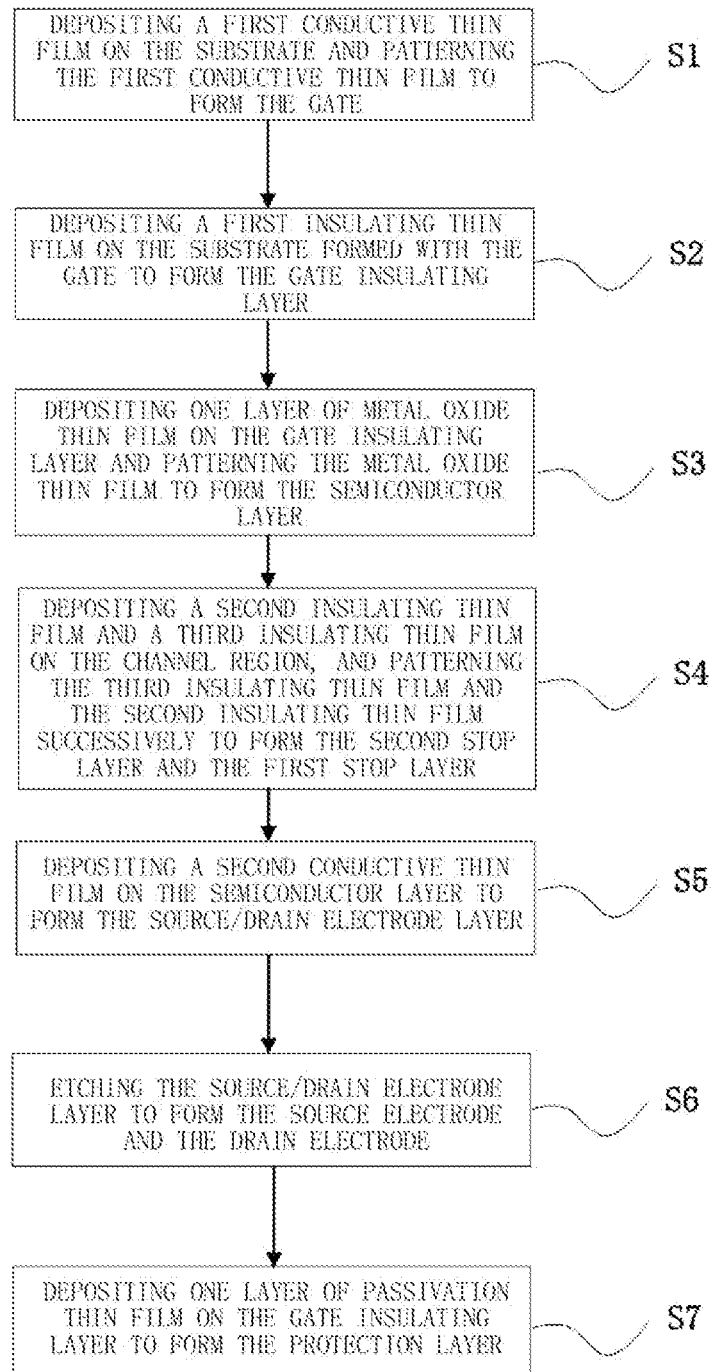
FIG. 3 is a flow schematic diagram of the method for preparing the thin film transistor of the present disclosure.

Referring to FIG. 3, the present embodiment further provides a method for preparing the thin film transistor, wherein the patterning process in the following methods include various processes for forming predetermined graphics such as a photoetching process, an etching process, a printing process, and an inkjet process, etc.; and the photoetching process refers to a process for forming graphics by using photoresist, shadow masks and exposure machines, etc., while these process are well known to those skilled in the art, which will not be repeated herein. The method includes the following steps.

Step S1: depositing a first conductive thin film on the substrate 1 by using a magnetron sputtering (PVD) method and patterning the first conductive thin film to form the gate 2.

Step S2: depositing a first insulating thin film on the substrate 1 formed with the gate 2 by using a plasma enhanced chemical vapor deposition (PECVD) method to form the gate insulating layer 3, so that the gate insulating layer 3 completely covers the gate 2.

Step S3: depositing one layer of metal oxide thin film on the gate insulating layer 3 by using a magnetron sputtering (PVD) method and patterning the metal oxide thin film to form the semiconductor layer 4, so that a channel region of the semiconductor layer 4 corresponds to the gate 2.

Step S4: depositing a second insulating thin film and a third insulating thin film successively on a side of the channel region, the side being away from the gate 2, and patterning the third insulating thin film and the second insulating thin film successively to form the second stop layer 5b and the first stop layer 5a.

In the step S4, a magnetron sputtering (PVD) method, an atomic layer deposition (ALD) method or a metal-organic chemical vapor deposition (MOCVD) method can be adopted to form the first stop layer 5a, and preferably, the atomic layer deposition (ALD) method is used to form the first stop layer 5a; and a plasma enhanced chemical vapor deposition (PECVD) method is adopted to form the second stop layer 5b on the first stop layer 5a.

Preferably, the first stop layer 5a is an aluminum oxide thin film having a thickness of 10-2000 Å; and the second stop layer 5b is a silicon dioxide thin film having a thickness of 50-3000 Å, wherein a temperature for preparing the second stop layer 5b is 100° C.-250° C.

Since the first stop layer 5a is provided between the second stop layer 5b and the semiconductor layer 4, when the second stop layer 5b is prepared by using reaction gases such as $SiH_4$ and $N_2O$ or TEOS and $O_2$ at a high temperature, hydrogen included in the second stop layer 5b may not diffuse into the semiconductor layer 4, and the first stop layer 5a does not include hydrogen, in this way, a reduction reaction which will lead to electrical properties degradation of the thin film transistor may not occur in the semiconductor layer 4.

The first stop layer 5a is an aluminum oxide thin film, while the film-forming rate of the aluminum oxide thin film is slow, the equipment for producing the same is complex, and the production cost thereof is high, which goes against industrialization. Therefore, in order to reduce film-forming time and improve productivity, preferably, a thickness of the first stop layer 5a is 10-2000 Å, and a thickness of the second stop layer 5b is 50-3000 Å. The aluminum oxide thin film can be prepared at a low temperature, and the first stop layer 5a can also prevent the thin film transistor from being damaged when producing the second stop layer 5b at a high temperature.

Step S5: depositing a second conductive thin film on the semiconductor layer 4 by using a magnetron sputtering (PVD) method to form the source/drain electrode layer 6, so that the source/drain electrode layer 6 completely covers the first stop layer 5a and the second stop layer 5b.

Step S6: etching the source/drain electrode layer 6 to form the source electrode 6a and the drain electrode 6b, so that the source electrode 6a and the drain electrode 6b are separated from each other, and are provided respectively at both sides of the first stop layer 5a and the second stop layer 5b.

Step S7: depositing one layer of passivation thin film on the insulating layer 3 by using a plasma enhanced chemical vapor deposition (PECVD) method to form the protection layer 7, so that the protection layer 7 completely covers the semiconductor layer 4, the etch stop layer 5 and the source/drain electrode layer 6.

The methods for preparing the gate 2, the gate insulating layer 3, the semiconductor layer 4, the etch stop layer 5 and the source/drain electrode layer 6 in the thin film transistor as set forth in the present embodiment are only illustrated as examples, which are not used for limiting the present disclosure, and the methods for preparing the gate 2, the gate insulating layer 3, the semiconductor layer 4, the etch stop layer 5 and the source/drain electrode layer 6 may also be other methods well known to those skilled in the art, which will not be repeated herein.

Based on above, it can be seen that, the thin film transistor and the method for preparing the same as proposed in the present disclosure adopt the $SiO_2/Al_2O_3$ double layer thin film structure to replace the $SiO_2$ single layer thin film structure as the etch stop layer, wherein the $Al_2O_3$ thin film layer is relatively thin, and the $SiO_2$ thin film is relatively thick. In this way, the $Al_2O_3$ thin film layer does not include hydrogen, which can avoid the reduction reaction of the metal oxide; the $Al_2O_3$ can be prepared at a low temperature so as to prevent the device from being damaged by a high temperature; the $Al_2O_3$ is relatively thin, which can reduce the film-forming time and increase productivity; also, with the $Al_2O_3$ being a basis, the $SiO_2$ can be prepared at a lower temperature so as to prevent the device from being damaged by a high temperature.

The above statements are only the specific embodiments of the present application, it should be pointed out that, to those ordinary skilled in the art, several improvements and modifications can be made without breaking away from the principle of the present application, also those improvements and modifications should be considered as being included in the protection scope of the present application.

The invention claimed is:

1. A method for preparing a thin film transistor, wherein the method includes:

depositing a first conductive film on a substrate and patterning the thin film to form a gate;

depositing a first insulating thin film on the substrate formed with the gate to form a gate insulating layer, so that the gate insulating layer completely covers the gate;

depositing one layer of metal oxide thin film on the gate insulating layer and patterning the metal oxide thin film to form a semiconductor layer, so that a channel region of the semiconductor layer corresponds to the gate;

depositing a second insulating thin film and a third insulating thin film successively on a side of the channel region, the side being away from the gate, and patterning the third insulating thin film and the second insulating thin film successively to form a second stop layer and a first stop layer, such that the second stop layer is provided on the first stop layer;

depositing a second conductive thin film on the semiconductor layer to form a source/drain electrode layer, so that the source/drain electrode layer completely covers the first stop layer and the second stop layer; and etching the source/drain electrode to layer to form a source electrode and a drain electrode, so that the source electrode and the drain electrode are separated from each other and are located at both sides of the first stop layer and the second stop layer, wherein the first stop layer is an aluminum oxide thin film formed at a first temperature, and the second stop layer is a silicon dioxide thin film formed at a second temperature, wherein the second temperature is lower than the first temperature, and wherein the first stop layer contains no hydrogen.

2. The preparing method of claim 1, wherein a thickness of the first stop layer is 10-2000 Å, and a thickness of the second stop layer is 50-3000 Å.

3. The preparing method of claim 1, wherein the second temperature for forming the second stop layer is 100° C.-250° C.

4. The preparing method of claim 1, wherein the thin film transistor further includes a protection layer provided on the gate insulating layer and completely covering the semiconductor layer, the source/drain electrode layer and the etch stop layer, and the method further includes:

depositing one layer of passivation thin film on the gate insulating layer to form the protection layer, so that the protection layer completely covers the semiconductor layer, the source/drain electrode layer and the etch stop layer.

5. The preparing method of claim 1, wherein the gate is copper or copper alloy.

* * * * *